US010892548B2

(12) United States Patent
Neto et al.

(10) Patent No.: US 10,892,548 B2
(45) Date of Patent: Jan. 12, 2021

(54) PHOTOCONDUCTIVE ANTENNA ARRAY

(71) Applicant: Technische Universiteit Delft, Delft (NL)

(72) Inventors: Andrea Neto, Delft (NL); Alessandro Garufo, Delft (NL); Giorgio Carluccio, Delft (NL); Nuria Llombart Juan, Delft (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 350 days.

(21) Appl. No.: 15/750,060

(22) PCT Filed: Aug. 4, 2016

(86) PCT No.: PCT/NL2016/050567
§ 371 (c)(1),
(2) Date: Feb. 2, 2018

(87) PCT Pub. No.: WO2017/023172
PCT Pub. Date: Feb. 9, 2017

(65) Prior Publication Data
US 2018/0226715 A1  Aug. 9, 2018

(30) Foreign Application Priority Data
Aug. 4, 2015  (NL) .................................. 2015262

(51) Int. Cl.
H01Q 3/00   (2006.01)
H01Q 3/26   (2006.01)
(Continued)

(52) U.S. Cl.
CPC ..... *H01Q 3/2676* (2013.01); *H01L 31/02325* (2013.01); *H01Q 19/062* (2013.01);
(Continued)

(58) Field of Classification Search
CPC .. H01Q 3/2676; H01Q 19/062; H01Q 21/061; G02F 2/02; H04B 10/90; H01L 31/02325; H01L 31/09
(Continued)

(56) References Cited

U.S. PATENT DOCUMENTS 5,248,884 A    9/1993   Brewitt-Taylor et al.
7,615,787 B2 * 11/2009  Ouchi .................. G01J 3/0256
                                                      257/76
(Continued)

FOREIGN PATENT DOCUMENTS

CN   102904068 A   1/2013
CN   103081126 A   5/2013
(Continued)

OTHER PUBLICATIONS

Office Action from CN 201680054398.4 dated Oct. 25, 2019 (with English translation).
(Continued)

Primary Examiner — Chuong P Nguyen
(74) Attorney, Agent, or Firm — Adsero IP

(57) ABSTRACT

A photoconductive antenna has an array of antenna electrodes on or in a photoconductive substrate. The photoconductive substrate is irradiated with light from a pulsed laser via micro-lenses above respective gaps between antenna electrodes. This makes the photoconductive substrate temporarily conductive, causing pulsed electric antenna currents that can be used for transmission of electromagnetic radiation in the Terahertz range. The bias circuit of the antenna is configured to determine voltages applied to the antenna electrodes by capacitive voltage division over a series of successive capacitors, each capacitor being formed by the antenna electrodes of a respective pair of successive ones of
(Continued)

the antenna electrodes in the array as plates of the capacitor adjacent to a respective one of the gaps.

16 Claims, 5 Drawing Sheets

(51) Int. Cl.
H01L 31/0232 (2014.01)
H01Q 19/06 (2006.01)
H01Q 21/06 (2006.01)
G02F 2/02 (2006.01)
H01L 31/09 (2006.01)
H04B 10/90 (2013.01)

(52) U.S. Cl.
CPC ............ *H01Q 21/061* (2013.01); *G02F 2/02* (2013.01); *G02F 2202/12* (2013.01); *G02F 2203/13* (2013.01); *H01L 31/09* (2013.01); *H04B 10/90* (2013.01)

(58) Field of Classification Search
USPC .......................................................... 342/368
See application file for complete search history.

(56) References Cited

U.S. PATENT DOCUMENTS

| | | | | |
|---|---|---|---|---|
| 7,847,254 | B2* | 12/2010 | Rafailov | H01L 31/095 250/341.1 |
| 7,884,942 | B2* | 2/2011 | Umetsu | G01J 3/42 356/445 |
| 8,314,392 | B2* | 11/2012 | Daisy | H01Q 9/285 250/341.1 |
| 8,872,107 | B2* | 10/2014 | Tomioka | H01Q 23/00 250/330 |
| 9,144,806 | B2* | 9/2015 | Chen | B03C 5/024 |
| 9,804,026 | B2* | 10/2017 | Jarrahi | H01L 31/09 |
| 10,069,024 | B2* | 9/2018 | Baik | H01L 31/085 |
| 10,147,832 | B2* | 12/2018 | Moon | H01L 31/08 |
| 10,164,080 | B2* | 12/2018 | Majima | H01L 29/0649 |
| 2009/0225311 | A1* | 9/2009 | Umetsu | G01J 3/0208 356/317 |
| 2010/0276594 | A1* | 11/2010 | Rafailov | H01L 31/095 250/338.4 |
| 2014/0197425 | A1 | 7/2014 | Moon et al. | |
| 2015/0228840 | A1* | 8/2015 | Takenaka | H01L 31/16 250/330 |
| 2018/0058931 | A1* | 3/2018 | Jarrahi | H01L 31/035209 |

FOREIGN PATENT DOCUMENTS

| | | |
|---|---|---|
| DE | 10 2006 059 573 B3 | 3/2008 |
| JP | 2012094705 A | 5/2012 |

OTHER PUBLICATIONS

Plinski (2010) Bulletin of the Pollish Academy of Sciences Technical Sciences 58(4):463-470, "Terahertz photomixer".

International Search Report from PCT/NL2016/050567 dated Nov. 7, 2016.

Jooshesh et al. (2014) Optics Express 22(23):27992-28001"Nonoplasmonics enhanced terahertz sources".

Park et al. (2011) Transducers'11 Beihing, China W3P.132:2498-2501 "Nanoplasmonic Photoconductive Antenna for High Power Terahertz Emission".

* cited by examiner

PHOTOCONDUCTIVE ANTENNA ARRAY

RELATED APPLICATIONS

This application is a 35 U.S.C. § 371 national phase application of PCT/NL2016/050567 (WO 2017/023172), filed on Aug. 4, 2016, entitled "Photoconductive Antenna Array", which application claims priority to Netherlands Application No. 2015262, filed Aug. 4, 2015, which is incorporated herein by reference in its entirety.

FIELD OF THE INVENTION

The invention relates to a photoconductive antenna array.

BACKGROUND

In a photoconductive antenna light pulses are used to excite currents with high frequency components in the antenna. Currents with spectral components in the Terahertz range may be excited for example, using laser pulses with durations in the order of picoseconds. For this purpose, antenna electrodes are provided on a photoconductive substrate, with a gap between antenna electrodes. Intense short laser pulses are applied to the photoconductive substrate. The pulses cause sharp increases in the conductivity in the gap between the antenna electrodes.

When the antenna is used for transmission, a DC voltage is applied between the electrodes, so that the pulsed conductivity increases result in pulsed current increases through the antenna electrodes. In turn the current excites radiation of an electromagnetic field with spectral components in a frequency range corresponding to the sharpness of the current increases. Spectral components in the range of 0.1-5 THz are known to be possible.

JP2012094705 discloses a photoconductive antenna with an array of parallel antenna electrode strips on a photoconductive substrate, with gaps between the strips. The document discusses various ways of applying DC voltages. In one embodiment, the ends of the strips are connected to successive taps of a resistive DC voltage divider, so that successive voltage differences of the same polarity are applied between successive pairs of the strips. As noted in the document, use of the same polarities ensures that the radiated electromagnetic fields of all gaps have the same phase, so that the radiated electromagnetic fields add up in a broadside direction, i.e. in the direction perpendicular to the plane of the substrate on which the antenna electrodes are provided.

A Terahertz source is described in an article by Afshin Jooshesh et g, titled "Nanoplasmanonics enhanced terahertz sources", published in Optical Express part 22 No 23 page 27992 (EPO reference XP05527137). Jooshesh discloses the use of an array of hexagonal nano-structures over the gap between the electrodes to enable an increase of the bias field and carrier density. Jooshesh shows an example of with a five micrometer dipole gap covered by an array of metallic nano hexagons of about half a micron in size with 100-200 nanometer gaps between the hexagons. Along the direction of the bias field the apexes at the corners of the hexagons point to each other, to create a higher local bias field and localize the photo-carriers. Another Terahertz source is disclosed in an article by Park et al, titled "Nanoplasmonic photoconductive antenna for high power Terahertz transmission", published at the 2011 16th International conference on sulidstate sensors, actuators and microsystems (Transducers 2011), IEEE pages 2498-2501 (EPO reference XP031911058). Park integrated plasmonically matched metal nanostructures on the dipole gap of a Terahertz bow tie antenna. The plasmonic resonance wavelength is matched to the optical wavelength (800 nm) of the light beam that is used to excite the device, to increase the coupling efficiency of the light.

Similarly, US20140197425 discloses a Terahertz wave generator with a 2D light crystal structure to enhance light absorption.

For efficient antenna operation, impedance matching is desirable. As is known per se, in an any antenna system where generated voltages are applied to antenna to create emission of electromagnetic radiation, a generator impedance and an antenna impedance can be distinguished. The energy "dissipation" according to the real part of the antenna impedance corresponds to energy lost from the antenna due to emission of radiation, and it characterizes how the voltage between the antenna terminals rises with increasing current. The generator impedance characterizes the way in which the generator voltage drops with increasing current. Antenna efficiency is low when the generator impedance and the antenna impedance are not of the same order of magnitude and antenna efficiency is optimal when they are matched.

Antenna impedance values may depend on antenna geometry, but will almost always be in the order of magnitude of a few hundred Ohm. In photoconductive antennas the real part of the equivalent generator impedance is determined by the impedance of the photoconductive layer between successive pairs of strips. In known photoconductive antennas this equivalent generator impedance is usually much higher than the antenna impedance. This leads to inefficient antenna systems. It would be desirable to have an antenna design wherein impedance matching can be optimized, or the impedances can at least be made of the same order of magnitude (e.g. with no more than a factor three and preferably two either way between the generator impedance and the antenna impedance). The prior art does not consider this problem.

SUMMARY

Among others it is an object to provide for a photoconductive antenna with an improved biasing structure.

According to one aspect a photoconductive antenna is provided that comprises
 a photoconductive substrate;
 an array of antenna electrodes on or in the substrate;
 a bias circuit configured to determine voltages applied to the antenna electrodes by capacitive voltage division over a series of successive capacitors, each capacitor being formed by the antenna electrodes of a respective pair of successive ones of the antenna electrodes in the array as plates of the capacitor.

By using capacitive voltage division to bias the antenna electrodes, same polarity biasing of all antenna currents during emission of electromagnetic radiation from the antenna can easily be ensured. Continuous traveling waves from one antenna electrode to the next are made possible. The applied voltages are determined by capacitive voltage division when no individual voltage sources are connected to different electrodes and there are no resistive connections to the antenna electrodes, other than via the photo-conductive substrate, or at least not with resistances that lead to charge flow that is significant compared to the charge on the capacitors formed by the antenna electrodes between the light pulses used to excite the antenna. Use of capacitive voltage division simplifies biasing significantly compared to where the voltage need to be determined by DC biasing.

According to a further aspect, successive ones of the antenna electrodes of each of the respective pairs are separated by gaps between pairs of successive ones of the antenna electrodes; the photoconductive antenna further comprises a plurality of micro-lenses located over the photoconductive substrate, each micro-lens being configured to concentrate incoming light on a part of the photoconductive substrate on or in which a respective one of the gaps is located. The micro lenses make it possible to raise the light intensities in the gaps, and thereby to lower the generator impedance.

In an embodiment the successive ones of the antenna electrodes each of the respective pairs is separated by a respective slot, each slot comprising a narrowed sub-section, leaving a gap between pairs of successive ones of the antenna electrodes wherein the slot is narrower than outside said subsection. Use of narrowed gaps makes it possible to lower the effective generator impedance of the antenna system and even to optimize impedance matching.

An embodiment comprises a plurality of micro-lenses located over the photoconductive substrate, each micro-lens being configured to concentrate incoming light on a part of the photoconductive substrate on or in which a respective one of the gaps is located. The micro lenses make it possible to raise the light intensities in the gaps, and thereby to lower the generator impedance.

In an embodiment, each of the antenna electrodes has a form comprising an elongated strip, the elongated strips of the antenna electrodes extending in parallel with each other along their length, separated by slots. In a further embodiment, each slot comprises a series of narrowed subsections, leaving a series of gaps between pairs of successive ones of the antenna electrodes wherein the slot is narrower than outside said subsections. Use of narrowed gaps makes it possible to lower the effective generator impedance of the antenna system and even to optimize impedance matching.

In an embodiment, the array of antenna electrodes comprises a two dimensional array of islands of conductive material on or in the photoconductive substrate, the bias circuit being configured to apply a voltage difference between a first voltage of the islands in a first row of the array, and a second voltage of the islands in a second row of the array, the first and second row lying at opposite ends of the array. This minimizes cross-currents.

In an embodiment, the antenna comprises an antenna lens located adjacent the photoconductive substrate, configured to collect electromagnetic radiation generated by electric currents through the antenna electrodes. This may be used to improve directivity.

BRIEF DESCRIPTION OF THE DRAWING

These and other objects and advantageous aspects will be become apparent from a description of exemplary embodiments with reference to the following figures.

DETAILED DESCRIPTION OF EXEMPLARY EMBODIMENTS

Figure 1:
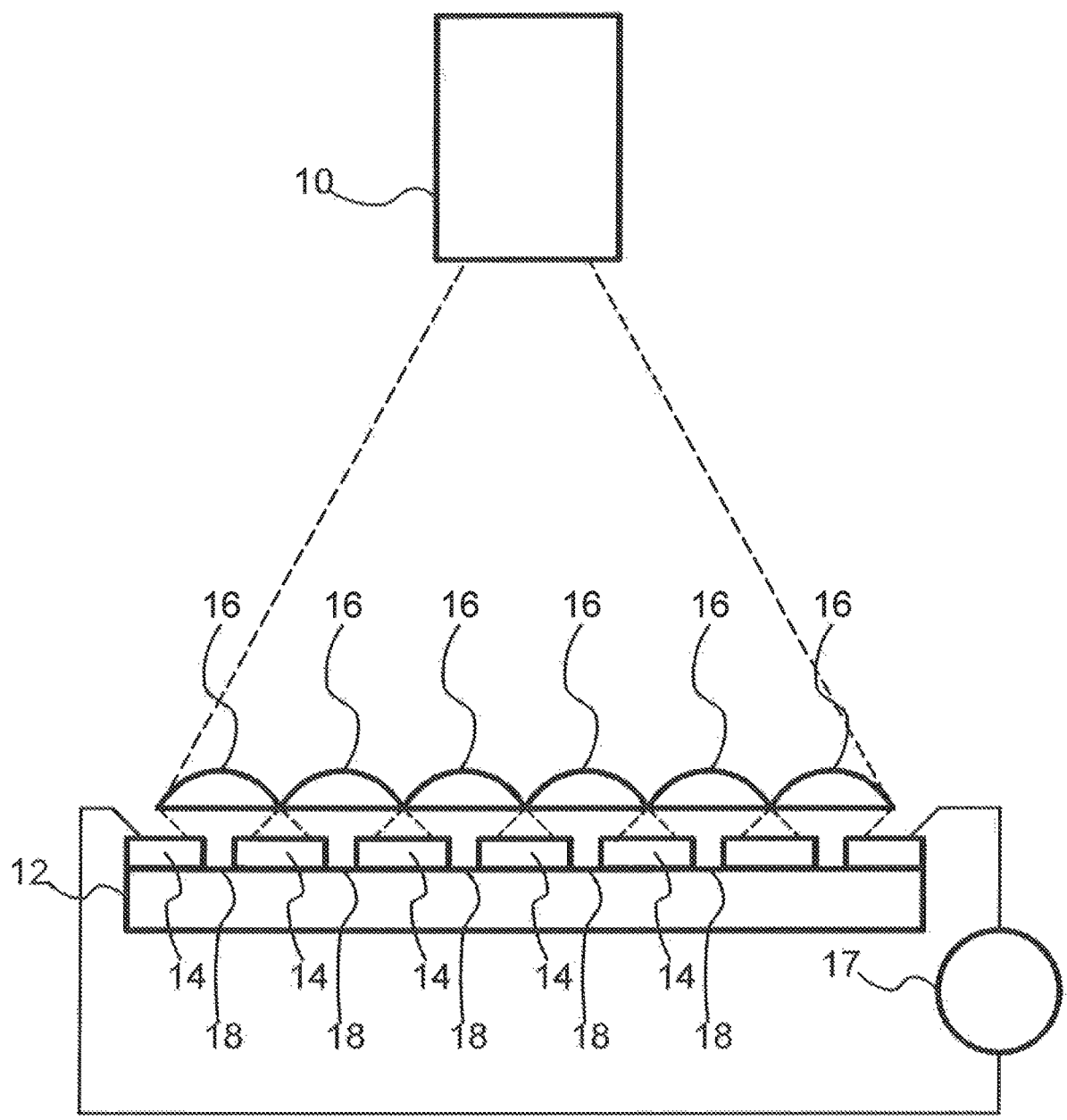
FIG. 1 shows a photoconductive antenna system

FIG. 1 schematically shows a photoconductive antenna system. The system comprises a pulsed laser source 10, a photoconductive layer 12, electrodes 14, irradiation lenses 16 and a voltage supply circuit 17. Photoconductive layer 12 and electrodes 14 form the photoconductive antenna as such. Photoconductive layer 12 forms a photoconductive substrate for electrodes 14. Electrodes 14 are provided on top of photoconductive layer 12 in electrical contact with photoconductive layer 12, alternatively, the electrodes may be embedded in photoconductive layer 12, e.g. near its surface and covered on all sides by photoconductive material. A plurality of separate electrodes 14 is used, with gaps 18 between electrodes 14. Voltage supply circuit 17 is coupled to the outermost ones of electrodes 14. Irradiation lenses 16 are provided between pulsed laser source 10 and electrodes 14. Irradiation lenses 16 are located to concentrate light from pulsed laser source 10 in gaps 18. Photoconductive layer 12 may be a gallium-arsenide semi-conductor layer for example, but any other photoconductor may be used.

Preferably, the number of separate electrodes 14 is so large that the width of the antenna, as measured from the leftmost electrode to the rightmost electrode, is substantially larger than the wavelengths of the Terahertz radiation that will be transmitted or received by the antenna. This makes it possible to create a directive antenna pattern with electrodes 14. The wavelength of the Terahertz radiation is roughly a hundred micrometer and an antenna width of at least half a millimeter is preferred. The width of individual electrodes 14 may be smaller than the Terahertz wavelengths and the gaps 18 may be much smaller than the widths of electrodes 14, e.g. of the order of the size of light spots that can be focused on gaps 18, for example at least one micrometer or at least two micrometer.

Figure 2:
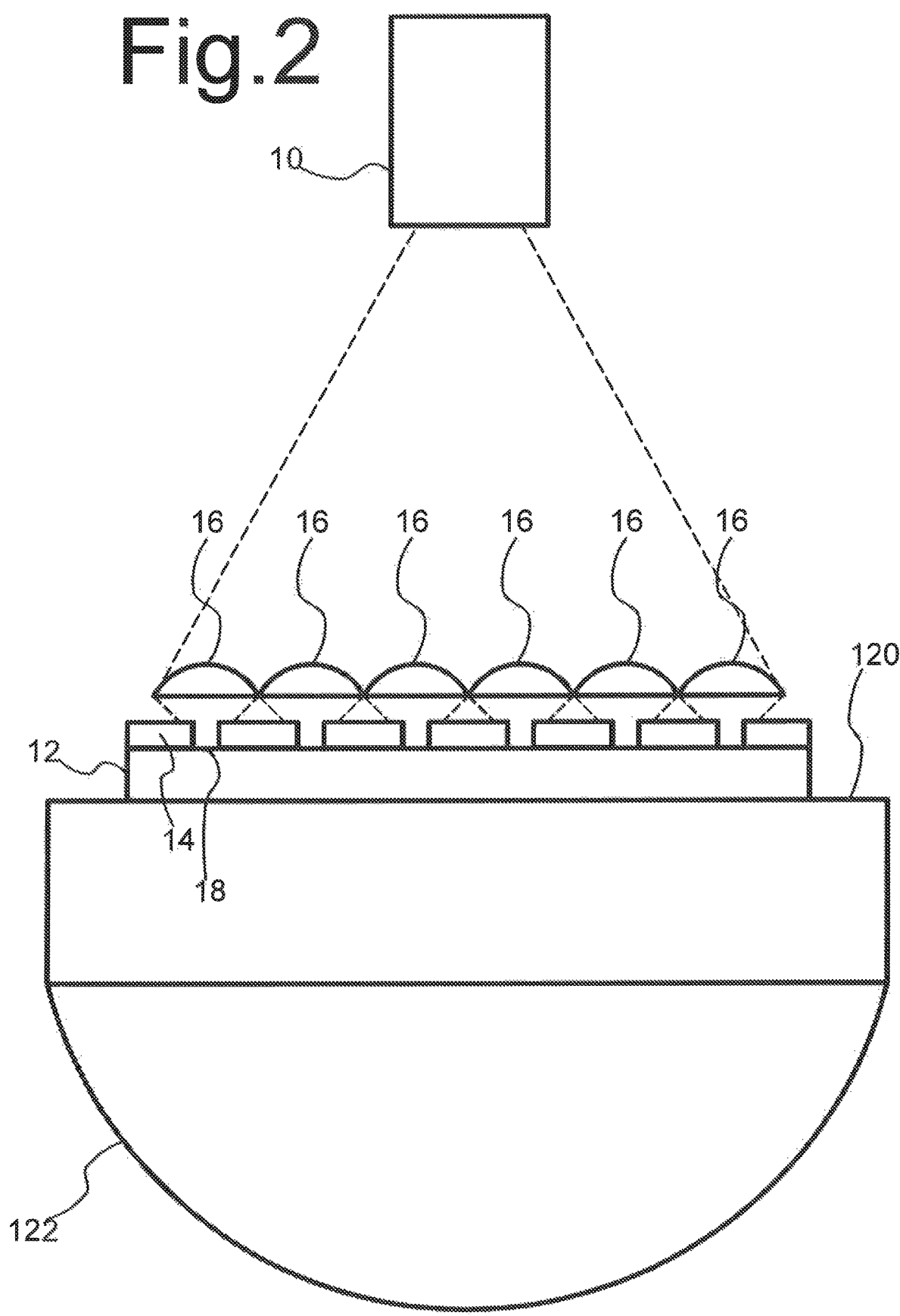
FIG. 2 shows a further photoconductive antenna system

FIG. 2 shows a more elaborate system photoconductive antenna system, comprising a carrier 120 and an antenna lens 122, wherein photoconductive layer 12 is provided on one surface of carrier 120 and antenna lens 122 is provided on the opposite surface of carrier 120. Antenna lens 122 is configured to narrow the beam of electromagnetic radiation generated by currents through electrodes 14 and photoconductive layer 12. In this embodiment, photoconductive layer 12, electrodes 14, carrier 120 and antenna lens 122 form the photoconductive antenna as such.

Figure 3:
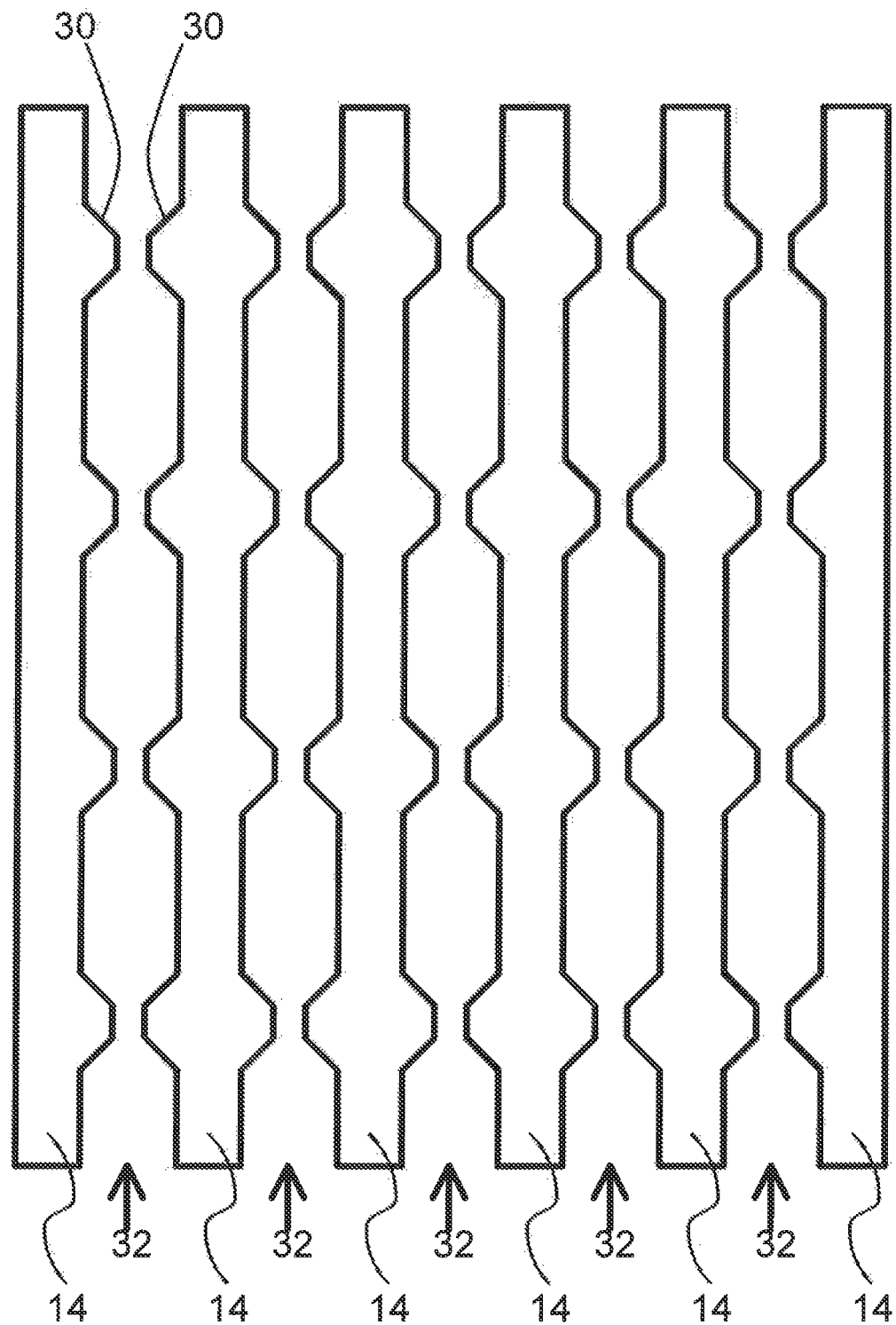
FIG. 3 shows a detail of electrodes in an antenna electrode array

FIG. 3 shows a detail of electrodes 14 in an embodiment of the antenna system, seen in a direction perpendicular to the surface of the photoconductive layer (not shown). In this embodiment, electrodes 14 are elongated strips, separated by slots 32. As used herein, the term "slot" is used, in its usual sense in the art of antennas, to refer to a space separating electrically conductive structures like the strips, irrespective of whether this space is (partly) filled with photoconductive material. As used herein, the term "slot" does not imply or deny any structure in the photoconductive material, such as a groove, or a space where photoconductive material is absent: the photoconductive material may have a continuous flat surface in the plane of the antenna.

At a plurality of positions along at least one of the strips, the strip has protrusions 30 extending towards a neighboring strip. At the positions of the protrusions, the slots 32 narrow to form the gaps 18. In the illustrated embodiment, these narrowed gaps are formed at corresponding positions on opposite sides of the strips, so that the distance between pairs of narrowed gaps on opposite sides of the strips is minimal. In an alternative embodiment, the narrowed gaps are formed on opposite sides of a strip may be offset. This may be used to create THz currents in an oblique direction through electrodes 14. However, minimal distances are preferred as they allow for higher power and wider bandwidth.

As shown, the strips on both sides of the narrowed gaps between the strips have protrusions and the gaps arise between these protrusions. This helps to concentrate current, but it is not indispensable: in another embodiment a protrusion may be provided only on an electrode on one side of the narrowed gap, facing a straight part of the electrode on the other side of the narrowed gap where there is no protrusion or even facing an indentation in the electrode on the other side of the gap. In an embodiment, one or more further islands of electrical conductor material may be present in a gap, thus further narrowing the distance bridged by the photoconductive material. But preferably, the entire distance between the protrusion(s) from the electrode(s) is bridged by the photoconductive material.

Figure 4:
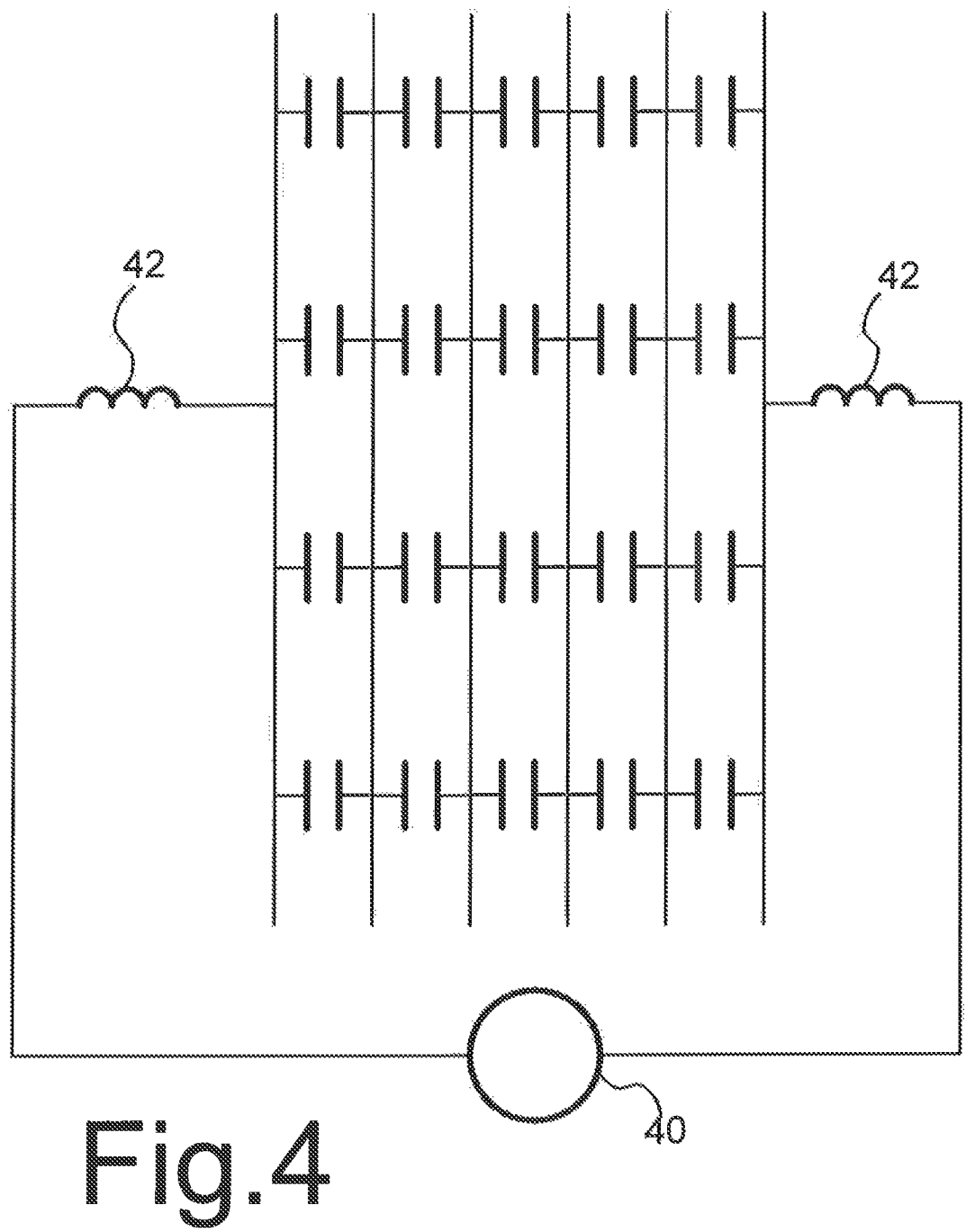
FIG. 4 shows a resulting electrical schematic structure

FIG. 4 shows a resulting electrical schematic structure, wherein the voltage supply circuit is represented by a voltage source 40 and inductances 42. Inductances 42 may be effective inductances formed by lengths of transmission line. Inductances 42 function to counteract current changes in the current from voltage source 40 at the time scale of the duration of pulses from pulsed laser source 10, but not at the time scale of pulse repetition. In an embodiment the role of the inductances is to present an open circuit at least in the THz range, so that THz currents remain bounded to electrodes 14 and photoconductive layer 12, whereas current can flow from the voltage source 40 at frequencies in the range of the pulse repetition rate, for example in the range of 100 MHz Absent conductivity in the photoconductive layer, each pair of successive electrodes forms a capacitor structure, with the successive electrodes as capacitor plates and the slots as gap between the plates. As should be noted, the electrodes other than the outermost electrodes are not connected to electrical connections that influence their electrical potential other than through their operation as capacitors and their connection via the photoconductive layer.

Thus, absent conductivity in the photoconductive layer and initial net charge on the inner electrodes, electrodes 14 are configured to operate as a capacitive voltage divider that divides the voltage from voltage supply circuit 17. Electrodes 14 operate as a capacitive voltage divider even if the photoconductive layer has some conductivity, when the leakage time constant defined by this conductivity and the capacitances formed by electrodes 14 is less than the time distance between the lase pulses (e.g. about 10 nanoseconds). Electrodes 14 also operate as a capacitive voltage divider even the electrodes other than the outermost electrodes are connected to other electrical connections that influence the potential In operation as a transmitting antenna voltage supply circuit 17 applies a DC voltage between outermost electrodes and pulsed laser source 10 emits laser light pulses. In an embodiment light pulses with a duration less than a picosecond (e.g. 200 femtosecond) may be used, with a repetition frequency in the order of 100 MHz, e.g. between 30 MHz and 300 MHz, or 50 MHz and 200 MHz. During each light pulse, the conductivity of photoconductive layer 12 rapidly increases due to the excitation of mobile charge carriers in photoconductive layer 12. This results in a temporary low resistance connection of the electrodes 14, and currents between electrodes 14 that reduce electric potential differences between electrodes 14.

The current excites an electromagnetic field that radiates from the antenna. The abrupt nature of the increase in current has the effect that the current and the radiated field have a frequency spectrum that contains a broad range of frequencies, up to a maximum frequency determined by the sharpness of the rise of the conductivity and/or the excitation properties of photoconductive layer 12. The sharpness of the laser pulses and the photoconductive layer 12 make it possible to create spectra wherein the maximum frequency lies in the THz range (e.g. between 1 and 10 THz). The strongest current densities occur in the gaps at the positions of protrusions 30, where the electric field is strongest and where the light is concentrated by irradiation lenses 16. After each pulse the conductivity of photoconductive layer 12 decays due to recombination. Preferably a photoconductive material like gallium arsenide is used, wherein the photoconductivity also decreases quickly after the end of the pulse (e.g. within less than a picosecond). This intensifies the high frequency part of the spectrum.

During time intervals between pulses from pulsed laser source 10, when the photoconductivity has decreased, electrodes 14 act as a series connection of capacitors, each capacitor corresponding to a respective pair of the electrodes and the slot between these electrodes. In the time intervals between pulses photoconductive layer 12 at most forms leakage paths through these capacitors, which can be neglected on a short time scale. Consequently, on such a time scale the set of electrodes 14 acts as a capacitive voltage divider, which divides the DC output voltage of voltage supply circuit 17 over the capacitors. Each electrode 14 is electrically polarized by separation of charges of opposite polarity that accumulate opposite neighboring electrodes 14. In an embodiment wherein the capacitances formed by all pairs of successive electrodes 14 are equal, the DC output voltage is divided equally over electrodes 14. In this way, each couple of consecutive strips presents the same voltage difference giving rise to biasing electric fields all oriented in the same direction across the slots between electrodes 14.

During the laser light pulses from pulsed laser source 10 conductivity of photoconductive layer 12 increases, and electric currents through photoconductive layer 12 arise that at least partly discharge the capacitors formed by electrodes 14, mostly through gaps 18. At time scales wherein inductances 42 do not allow current changes from voltage source 40, this reduces the voltage differences between electrodes 4 and including the overall voltage difference between the outermost electrodes. In a longer time scale, current from voltage source 40 causes the voltage between the outermost electrodes to rise and the capacitive voltage divider effect causes this distribution of this rise over the gaps between successive electrodes 14, for use during the next laser light pulse. When the voltages of electrodes 14 are initially not distributed in inverse proportion to the capacitances, the distribution will tend to distributed in inverse proportion to the capacitances, as a result of successive laser light pulses. In an embodiment one or more relatively longer laser light pulses (e.g. at least twice as long) may be used in advance of a series of relatively shorter laser light pulses to ensure that a distribution in inverse proportion to the capacitances is realized before the series of relatively shorter laser light pulses with which Terahertz radiation is generated.

The illustrated structure allows efficient distribution of gaps 18 on the surface without recurring to any mask on the photo-conducting material and on the electrodes. The currents all flow in the same direction. As a consequence the total current on the structure may be regarded as a continuous current across all electrodes, in the direction perpendicular to the length of the strips. This effectively realizes a connected array of antenna elements. Along the array electromagnetic surface waves can travel continuously in the direction perpendicular to the length of the strips.

In the array gaps 18 are characterized by a substantially frequency independent generator impedance. As is known per se, in an any antenna system where generated voltages are applied to antenna to create transmitted electromagnetic radiation, a generator impedance and an antenna impedance can be distinguished. Assuming perfectly conducting antenna electrodes, the energy "dissipation" according to the real part of the antenna impedance corresponds to energy lost from the antenna due to emission of radiation, and it characterizes how the voltage between the antenna terminals rises with increasing current. The generator impedance characterizes the way in which the generator voltage drops with increasing current. Antenna efficiency is low when the real parts of the generator impedance and the antenna impedance are not of the same order of magnitude and antenna efficiency is optimal when they are matched. Antenna impedance values may depend on antenna geometry, but will almost always be in the order of magnitude of a few hundred Ohm.

In photoconductive antennas an equivalent generator impedance is determined by the impedance of photoconductive layer 12 between successive pairs of electrodes 14 during the light pulses. In known photoconductive antennas this equivalent generator impedance is usually much higher than the antenna impedance, which leads to inefficient antenna systems.

In the present photoconductive antenna, the impedance is determined by the impedance of the photoconductive material in gaps 18 during the light pulses. The equivalent generator impedance formed by gaps 18 can be tuned by adjusting optical parameters such as laser power and focusing, electrical parameters such as the voltage from voltage supply circuit 17, by geometrical parameters such as the gap dimensions, i.e. the distance between adjacent electrodes in the gap (referred to as the gap width) and the length of the gap (the length of protrusions 30).

In an exemplary embodiment, a pulsed laser may be used that produces pulses of 80 fs FWHM width with a wavelength of 780 nm, a repetition rate of 82 MHz, and a mean power of 15 mW. An LT-GaAs photoconductor may be used with a thickness of $W\_z=1.5$ μm, a 10 by 10 micrometer gap size and corresponding laser spot size, and a biasing voltage of 30V applied at the electrodes. Assuming electric parameters typical value of the LT-GaAs photoconductor: a relative electric permittivity $\varepsilon\_r=13$; an absorption coefficient $\alpha=10^6$ m$^{-1}$ (the symbol "^" representing taking a power, i.e. $10^6=1000000$), electron and hole saturation velocities $v\_e=v\_h=10^4$ m/s, and carriers life-time $\tau\_e=\tau\_h=0.3$ ps, simulated photoconductance behavior of the gap peaks at about 0.043 Siemens within 0.05 picosecond. The conductivity drops off with a half value time of about 0.3 picosecond, producing an average conductivity of about 0.011 Siemens in a 1.5 picosecond time interval. This results in a generator impedance of 457 Ohm (assuming a laser fluence of 0.084 milli Joule per square centimeter.

For 5 by 5 micrometer and 2 by 2 gap sizes, the conductivity peaks at about 0.017 Siemens and 0.009 Siemens respectively, on the same time scale, resulting in averages of about 0.004 and 0.002 Siemens and generator impedances of 230 Ohm and 92 Ohm respectively. As may be seen, this enables matching antenna and generator impedance. Focusing the laser power on a small gap helps to obtain resistance value which are suitable to match the antenna impedance without risk of damage due high laser power and/or biasing voltage.

More laser power density in the gaps reduces the generator impedance. Irradiation lenses 16 serve to increase light intensity at gaps 18, at the expense of light intensity in areas outside the gaps, thereby reducing the equivalent generator impedance. Narrowing the gap and extending its length also reduces the generator impedance. Use of protrusions 30 serves to increase current density in the slots at the location of the gaps, thereby locally reducing the equivalent generator impedance. When the gap width (e.g. a few micrometer) is much smaller than the wavelength of interest (which is about 100 micrometer for THz applications) the impedance can be reasonably expected to be almost frequency independent over a wide bandwidth. For example this may be realized over a bandwidth of 0.1-5 THz.

The present antenna makes it possible to match the real part of the generator impedance defined by gaps 18 to that of the antenna impedance and to do so over a wide frequency band, or at least to make them of the same order of magnitude (e.g. with no more than a factor three and preferably two either way between the generator impedance and the antenna impedance). The ability to provide a generator impedance in the same order of magnitude as the antenna impedance significantly increases antenna efficiency.

In an embodiment a photoconductive material slab of gallium arsenide may be used (relative electric permittivity of 13, light absorption coefficient of $10^6$ per centimeter, electron and hole saturation velocities of $6\times10^4$ m/s and carrier life times of 0.3 picoseconds). In this embodiment a pulsed laser source with an operating wavelength of 800 nm, an optical power of 240 mW, a pulse width of 200 fs and a pulse repetition rate of 76 MHz may be used. A voltage source circuit which provides 18 Volts per gap may be used (i.e. Ny*18V if Ny+1 electrodes are used). Irradiation lenses with a radius of Rm=20 micrometer and an extension length of 0.62 Rm may be used.

A periodic array of gaps may be used, with periods dx and dy along the length of the electrodes and perpendicular to the electrodes respectively (dx and dy equal to 40 micrometer for example and each preferably at least 20 micrometer and more preferably at least 40 micrometer). Micrometer gaps may be used, with a distance Wy between the electrodes on opposite sides of the gap and the length of the gap Wx in the direction of the length of the strip (Wx and Wy equal to 2 micrometer for example). This results in gap capacitance values in the order of a few femtofarad (1-10 fF).

An array of Ny+1 electrodes in the form of electrically conductive strips is placed on the slab. With Nx gaps between every pair of successive strips. By way of example Ny=13 and Ny=13. Each pair of successive strips forms a slot of width Ws outside the gaps (Ws=15 micrometer for example). Thus, the total number of slots is Ny. The gaps are obtained by a periodical tapering of the slot. The distance between the centers of consecutive strips is dy, whereas the distance between the centers of consecutive gaps along each slot is dx. Therefore, the elementary cell of the connected array has dimensions dx*dy.

The arrangement of strips realizes an array of connected slots. The gaps of the slots and the periods along x and y of the connected array are designed in order to obtain a desired input impedance for each array element. Furthermore, they are designed in order to have a high biasing electric field on each gap for obtaining high current intensities when the photoconductor is excited. With the aim of feeding the array substantially only in the gaps and to efficiently use the optical power supplied by the laser and the array of irradiation lenses. This resulted in an estimated generator equivalent resistance of 220 Ohm, which is of the same order of magnitude as the antenna impedance. Fine tuning of the feeding gaps geometry, and optical design, in order to obtain a real equivalent impedance generator of value comparable to the antenna impedance may be essential when the THz power radiation must be maximized. However, in many cases sub-optimal power may suffice. On the surface of the photoconductive slab that is opposite to the surface on which the strips are located, a silicon antenna lens was placed for obtaining of the radiated power from the connected array. An antenna lens of radius R=2 mm and extension length E=0.3R may be used.

For reference it is noted that photoconductive antennas may also be used as a reception antenna, making use of the fact that incoming electromagnetic irradiation creates electric fields across the gaps, which affect the currents. A system may be used wherein the same light pulses are applied with a mutual delay to a transmission antenna and a reception antenna (or to the same antenna acting both as transmission antenna and reception antenna), when the reception antenna receives radiation from the transmission antenna after transmission and/or reflection via a medium. By measuring an effect of the electromagnetic irradiation for a series of different delays between the pulses spectrally resolved transmission and/or reflection measurements can be obtained. Moreover the photo-conductive connected arrays proposed are suitable solutions also as receiver of ultra-wide bandwidth THz radiation, increasing considerably the receiving signal-to-noise ratio. A receiver can be obtained simply using the same structures proposed without the DC bias scheme and connecting them directly to amperemeter for the read out of the output current.

Figure 5:
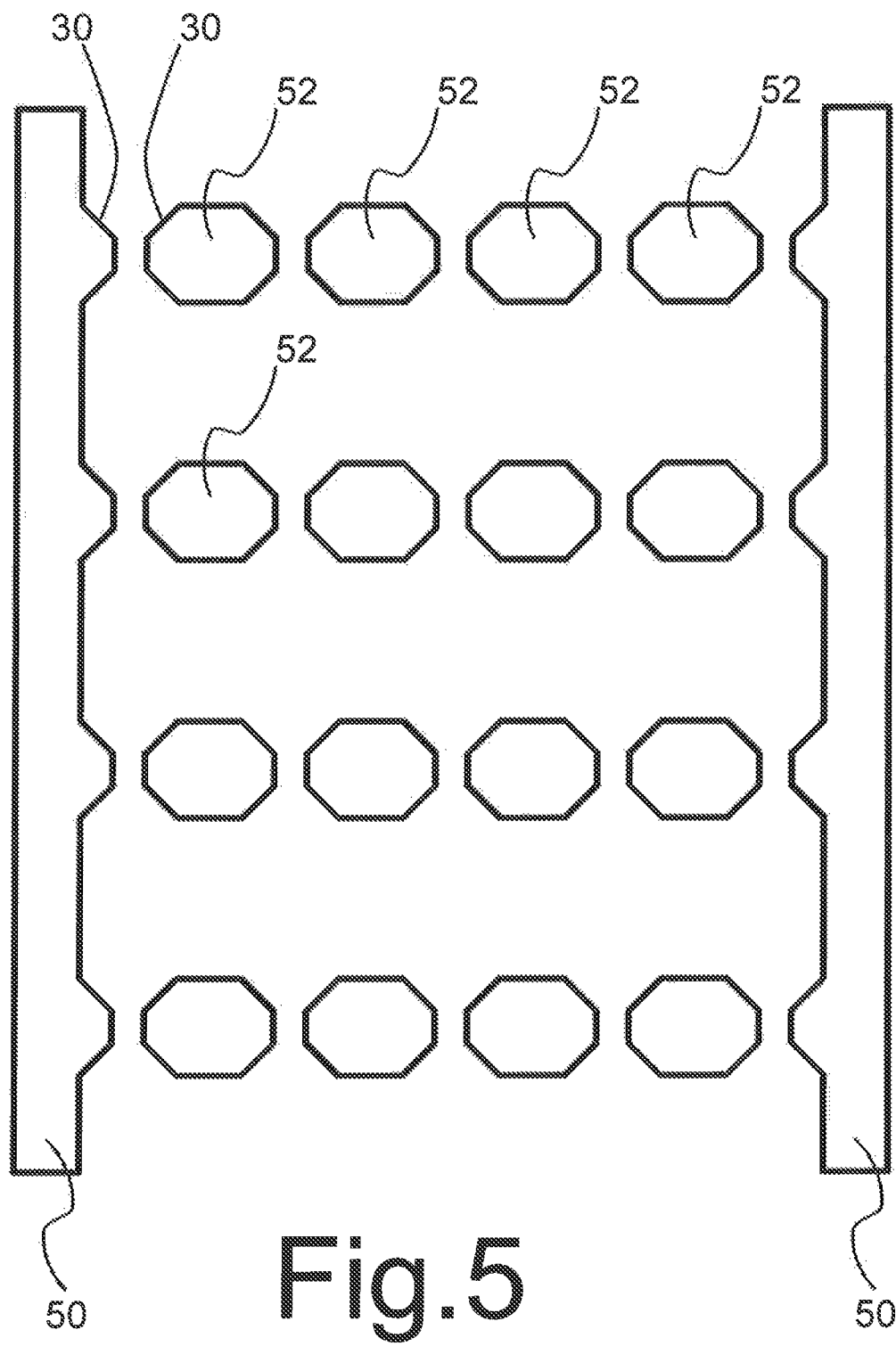
FIG. 5 shows an electrical structure of an alternative electrode layout

FIG. 5 shows an alternative electrode configuration, wherein all but the outermost electrodes 50 have been reduced to a series of islands 52 instead of continuous strips. Protrusions 30 are located in islands 52. Electrically the operation of FIGS. 4 and 5 is very similar. In both, capacitive charge accumulates mostly along gaps 18 in the time intervals between the light pulses from pulsed laser source 10. Similarly, in both the current during the pulses flows mainly at the gaps and through the part of the electrode body between the gaps on opposite sides of the electrodes. Lateral electrodes between islands 52 are not needed for these effects.

A difference between the embodiments of FIGS. 4 and 5 is that there is a plurality of parallel capacitive voltage dividers in the embodiment of FIG. 5, whereas there is only one parallel capacitive voltage divider in FIG. 4, or, equivalently, that there are lateral connections between a plurality of parallel capacitive voltage dividers. This equalizes the voltage distributions in the different capacitive voltage dividers. However, equal voltage distributions may be ensured in FIG. 5 when manufacturing tolerances are kept so small that capacitances of the gaps do not differ significantly. In the embodiment of FIG. 5, the THz currents can be more strictly spatially limited, which may improve antenna bandwidth and efficiency.

In an embodiment a photoconductive antenna, is provided comprising
    a photoconductive substrate;
    an array of antenna electrodes on or in the substrate;
    a bias circuit configured to determine voltages applied to the antenna electrodes by capacitive voltage division over a series of successive capacitors, each capacitor being formed by the antenna electrodes of a respective pair of successive ones of the antenna electrodes in the array as plates of the capacitor. In a further embodiment gaps between the pairs of successive ones of the antenna electrodes have a width of at least a micrometer. The gaps may have a length of at least two micrometer. The distance between successive ones of the gaps may be at least twenty micrometer and preferably at least forty micrometer.

In a further embodiment the successive ones of the antenna electrodes of each of the respective pairs are separated by a respective slot, each slot comprising a narrowed sub-section, leaving a gap between pairs of successive ones of the antenna electrodes wherein the slot is narrower than outside said subsection.

The invention claimed is:

1. A photoconductive antenna, comprising:
    a photoconductive substrate;
    an array of antenna electrodes on or in the photoconductive substrate;
    a bias circuit configured to determine voltages applied to the antenna electrodes by capacitive voltage division over a series of successive capacitors, each capacitor being formed by the antenna electrodes of a respective pair of successive ones of the antenna electrodes in the array as plates of the capacitor; wherein the successive ones of the antenna electrodes of each of the respective pairs are separated by gaps between pairs of successive ones of the antenna electrodes; wherein the successive ones of the antenna electrodes of each of the respective pairs are separated by a respective slot, each slot comprising a narrowed sub-section leaving said gap between pairs of successive ones of the antenna electrodes; wherein the slot is narrower in the narrowed sub-section than outside said narrowed sub-section; the photoconductive antenna further comprising:
    a plurality of micro-lenses located over the photoconductive substrate, each micro-lens being configured to concentrate incoming light on a part of the photoconductive substrate on or in which a respective one of the gaps is located.

2. The photoconductive antenna according to claim 1, wherein the antenna electrodes are electrically insulated from one another other than via the photoconductive substrate.

3. The photoconductive antenna according to claim 1, comprising a plurality of micro-lenses located over the photoconductive substrate, each micro-lens being configured to concentrate incoming light on a part of the photoconductive substrate on or in which a respective one of the gaps is located.

4. The photoconductive antenna according to claim 1, wherein the gaps have a width of at least a micrometer.

5. The photoconductive antenna according to claim 1, wherein the gaps have a length of at least two micrometer.

6. The photoconductive antenna according to claim 1, wherein a distance between successive ones of the gaps is at least twenty micrometer and preferably at least forty micrometer.

7. The photoconductive antenna according to claim 1, comprising an antenna lens located adjacent the photoconductive substrate, configured to collect electromagnetic radiation generated by electric currents through the antenna electrodes.

8. The photoconductive antenna according to claim 1, further comprising a pulsed laser light source directed at photoconductive substrate and configured to illuminate at least a part of the photoconductive substrate between the antenna electrodes.

9. A photoconductive antenna, comprising:
    a photoconductive substrate;
    an array of antenna electrodes on or in the photoconductive substrate;

a bias circuit configured to determine voltages applied to the antenna electrodes by capacitive voltage division over a series of successive capacitors, each capacitor being formed by the antenna electrodes of a respective pair of successive ones of the antenna electrodes in the array as plates of the capacitor; wherein the successive ones of the antenna electrodes of each of the respective pairs are separated by gaps between pairs of successive ones of the antenna electrodes; wherein the antenna electrodes define a two-dimensional array of the gaps between pairs of the antenna electrodes, the gaps being formed in narrowed sub-sections of respective slots separating successive antenna electrodes in the form of parallel elongated strips, or between parallel edges of electrode islands of a two dimensional array of electrode islands at positions corresponding to sections of the elongated strips between the gaps; the photoconductive antenna further comprising:

a plurality of micro-lenses located over the photoconductive substrate, each micro-lens being configured to concentrate incoming light on a part of the photoconductive substrate on or in which a respective one of the gaps is located.

10. The photoconductive antenna according to claim 9, further comprising a pulsed laser light source directed at photoconductive substrate and configured to illuminate at least a part of the photoconductive substrate between the antenna electrodes.

11. A photoconductive antenna, comprising:

a photoconductive substrate;

an array of antenna electrodes on or in the photoconductive substrate; wherein each of the antenna electrodes has a form comprising an elongated strip, the elongated strips of the antenna electrodes extending in parallel with each other along their length, separated by slots;

a bias circuit configured to determine voltages applied to the antenna electrodes by capacitive voltage division over a series of successive capacitors, each capacitor being formed by the antenna electrodes of a respective pair of successive ones of the antenna electrodes in the array as plates of the capacitor; wherein the successive ones of the antenna electrodes of each of the respective pairs are separated by gaps between pairs of successive ones of the antenna electrodes; the photoconductive antenna further comprising:

a plurality of micro-lenses located over the photoconductive substrate, each micro-lens being configured to concentrate incoming light on a part of the photoconductive substrate on or in which a respective one of the gaps is located.

12. The photoconductive antenna according to claim 11, wherein each slot comprises a series of narrowed sub-sections, leaving a series of gaps between pairs of successive ones of the antenna electrodes wherein the slot is narrower than outside said subsections.

13. The photoconductive antenna according to claim 11, further comprising a pulsed laser light source directed at photoconductive substrate and configured to illuminate at least a part of the photoconductive substrate between the antenna electrodes.

14. A photoconductive antenna, comprising:

a photoconductive substrate;

an array of antenna electrodes on or in the photoconductive substrate; wherein the array of antenna electrodes comprises a two dimensional array of rows and columns of islands of conductive material on or in the photoconductive substrate;

a bias circuit configured to determine voltages applied to the antenna electrodes by capacitive voltage division over a series of successive capacitors, each capacitor being formed by the antenna electrodes of a respective pair of successive ones of the antenna electrodes in the array as plates of the capacitor; the bias circuit being configured to apply a voltage difference between a first voltage of the islands in a first row of the array, and a second voltage of the islands in a second row of the array, the first and second row lying at opposite ends of the array, wherein the islands within each column of the array are separated from each other by respective slots between parallel edges of the islands, leaving a gap between pairs of successive ones of the islands in the column; the photoconductive antenna further comprising:

a plurality of micro-lenses located over the photoconductive substrate, each micro-lens being configured to concentrate incoming light on a part of the photoconductive substrate on or in which a respective one of the gaps is located.

15. The photoconductive antenna according to claim 14, wherein a width of the islands in the row direction of the array narrows down towards the parallel edges.

16. The photoconductive antenna according to claim 14, further comprising a pulsed laser light source directed at photoconductive substrate and configured to illuminate at least a part of the photoconductive substrate between the antenna electrodes.

* * * * *